(12) United States Patent
Fritsch et al.

(10) Patent No.: US 9,595,304 B1
(45) Date of Patent: Mar. 14, 2017

(54) CURRENT-MODE SENSE AMPLIFIER

(71) Applicant: International Business Machines Corporation, Armonk, NY (US)

(72) Inventors: Alexander Fritsch, Esslingen (DE); Ulrich Krauch, Dettenhausen (DE); Michael B. Kugel, Boeblingen (DE); Juergen Pille, Stuttgart (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/959,586

(22) Filed: Dec. 4, 2015

(51) Int. Cl.
　　*G11C 7/06* (2006.01)
　　*H03F 3/16* (2006.01)
　　*G11C 7/08* (2006.01)

(52) U.S. Cl.
　　CPC .............. *G11C 7/062* (2013.01); *G11C 7/06* (2013.01); *H03F 3/16* (2013.01); *G11C 7/08* (2013.01); *H03F 2200/462* (2013.01)

(58) Field of Classification Search
　　CPC .. G11C 7/06; G11C 7/062; H03F 3/16; H03F 2200/462
　　(Continued)

(56) References Cited

U.S. PATENT DOCUMENTS 6,323,693 B1　11/2001　Park
6,717,876 B2　 4/2004　Vlasenko et al.
(Continued)

OTHER PUBLICATIONS

Chang, Meng-Chou, "A low-power ternary content-addressble memory using pulse current based match-line sense amplifiers," Oct. 28-31, 2013, pp. 1-4; ASIC (ASICON), 2013 IEEE 10th International Conference.

(Continued)

*Primary Examiner* — Tan T. Nguyen
(74) *Attorney, Agent, or Firm* — Patterson + Sheridan, LLP (57) ABSTRACT

The invention relates to a current sense amplifier (103) comprising a reference current input terminal (109), a sense control line input terminal (125), a sense current input terminal (108), a first output terminal (106), and a second output terminal (107). The amplifier further comprises a first NAND gate (100) comprising an output terminal being connected to the first output terminal (106), a second NAND gate (101) comprising an output terminal being connected to the second output terminal (106), a first (T1, T5) and a second (T2, T6) cross coupled inverters, the first inverter comprising a first n-FET (T1) and the second inverter comprising a second n-FET (T2), a transmission gate (104) comprising a first and a second transmission terminal and a transmission control terminal, the transmission control terminal being connected to the sense control line input terminal (125), an AND gate (130) having a first input terminal connected to the first output terminal (106) and a second input terminal connected to the second output terminal (107), a third n-FET (T3) having a gate connected to an output terminal of the AND gate (130), a drain connected to the sense current input terminal, a source connected to ground, wherein a source of the first n-FET is connected to the sense current input terminal and a source of the second n-FET is connected to the reference current input terminal, a first input terminal of the first NAND gate and a first input terminal of the second NAND gate are connected to the sense control line input terminal, the first transmission terminal and a second input terminal of the first NAND gate are connected to an output terminal of the second inverter and the second transmission terminal and a second input terminal of the second NAND gate are connected to an output terminal of the first inverter.

15 Claims, 5 Drawing Sheets

(58) Field of Classification Search
USPC ......... 365/207, 154, 185.21, 189.07, 189.15, 365/205
See application file for complete search history.

(56) References Cited

U.S. PATENT DOCUMENTS

| | | | |
|---|---|---|---|
| 7,936,618 B2 | 5/2011 | Storms | |
| 2001/0024381 A1* | 9/2001 | Fuchigami | G11C 7/062 365/185.21 |
| 2002/0057597 A1 | 5/2002 | Fuchigami et al. | |
| 2005/0024909 A1 | 2/2005 | Kim | |
| 2009/0129345 A1* | 5/2009 | Wu | H04W 72/1231 370/337 |
| 2016/0071555 A1* | 3/2016 | Fritsch | G11C 7/065 365/189.09 |
| 2016/0072461 A1* | 3/2016 | Fritsch | G11C 7/14 365/72 |

OTHER PUBLICATIONS

Dutt, Ravi, et al., "High Speed Current Mode Sense Amplifier for SRAM Applications," Apr. 2012, vol. 2(5) pp. 1124-1127; IOSR Journal of Engineering; ISSN: 2250-3021.

* cited by examiner

|  | TRU 114 | CMP 113 | SENSE CONTROL 125 | ENABLE CONTROL 121 | RST 134 | OUT_1 106 | OUT_2 107 |
|---|---|---|---|---|---|---|---|
| PHASE 1 | X | X | 1 | 1 | 0 | 1 | 1 |
| PHASE 2 MISMATCH | 1 | 0 | 0 | 1 | 1 | 0 | 1 |
| PHASE 2 MATCH | 0 | 1 | 0 | 1 | 1 | 1 | 0 |

CURRENT-MODE SENSE AMPLIFIER

BACKGROUND

Several techniques may be implemented to read data in a memory cell. For instance a current sense amplifier may be used for reading the data stored in the memory cell. In this regard, the current sense amplifier may compare a cell current to a reference current. The reference current may be a current of a reference memory cell. When the memory cell is connected to the current sense amplifier via a bit line it causes two different currents flowing in said bit line depending on a logical value ("0" or "1") stored in said memory cell. Based on comparison of the current in said bit line against the reference current the current sense amplifier determines the logical value stored in said memory cell. The choice of current sense amplifiers for reading data stored in the memory cells is determined by the fact that the bit lines have high capacitance. Thus evaluation of currents flowing in the bit lines enables faster operation of digital circuitry in comparison with the case when evaluation of voltages is used for reading of data stored in the memory cells.

SUMMARY

One embodiment provides for a current sense amplifier comprising a reference current input terminal, a sense control line input terminal, a sense current input terminal, a first output terminal, and a second output terminal. The amplifier further comprises a first NAND gate comprising an output terminal being connected to the first output terminal, a second NAND gate comprising an output terminal being connected to the second output terminal, a first and a second cross coupled inverters, the first inverter comprising a first n-type field effect transistor (n-FET) and the second inverter comprising a second n-FET, a transmission gate comprising a first and a second transmission terminal and a transmission control terminal, the transmission control terminal being connected to the sense control line input terminal, an AND gate having a first input terminal connected to the first output terminal and a second input terminal connected to the second output terminal, a third n-FET having a gate connected to an output terminal of the AND gate, a drain connected to the sense current input terminal, a source connected to ground.

A source of the first n-FET is connected to the sense current input terminal. A source of the second n-FET is connected to the reference current input terminal. A first input terminal of the first NAND gate and a first input terminal of the second NAND gate are connected to the sense control line input terminal. The first transmission terminal and a second input terminal of the first NAND gate are connected to an output terminal of the second inverter. The second transmission terminal and a second input terminal of the second NAND gate are connected to an output terminal of the first inverter.

Another embodiment provides for an electronic circuit comprising static memory cells and a current sense amplifier according to the aforementioned embodiment. Each of the static memory cells comprises a first static memory cell and a first data output terminal for outputting data stored in the respective first static memory cell. The first data output terminals of each the first static memory cells are connected to the sense current input terminal, wherein each first data output terminal of said first static memory cells is connected via a respective first read n-FET stack the sense current input terminal.

BRIEF DESCRIPTION OF THE SEVERAL VIEWS OF THE DRAWINGS

In the following embodiments of the invention are explained in greater detail, by way of example only, making reference to the drawings in which.

DETAILED DESCRIPTION

Reduction of power consumption and increase in clock frequency are everlasting objectives of digital circuitry development. Achieving this objective comprises solving numerous optimization problems like reduction in peak power consumption and in overall power consumption, reduction of cross-talk between different nodes of circuitry, etc. Embodiments of the invention may address the aforementioned problems and may have numerous advantageous features. For instance, the current sense amplifier may comprise a current source configured to generate different reference currents. Configuration of the amplifier and coupling circuits (like for instance n-FET stacks) may enable current limitation in both cases "match" and "mismatch", i.e. when the reference current is lower than the sense current ("mismatch" case) and when the reference current is higher than the sense current ("match" case). The amplifier may be configured in a way that no DC currents except the leakage currents are flowing through the amplifier in a steady state. Nodes like input terminals and output terminals of the amplifier may be decoupled from each other and as a result thereof the operational clock frequency may be increased (e.g. in comparison with the conventional voltage sense amplifier). Reduction of cross-coupling between the input and terminals can be provided by reduced voltage swings in interconnect wirings immediately connected to the input terminals. The amplifier may be further configured that discharging of electronic circuits directly connected to sense and reference current input terminals of the current sense amplifier is automatically triggered by internal logic circuitry of the current sense amplifier. As a consequence thereof there may be no need for a dedicated external signal for triggering the discharging.

In another embodiment the transmission control terminal is operable for connecting and disconnecting the first with the second transmission terminal.

This feature may enable an effective way to drive the cross-coupled inverters out of steady latched state in order to prepare the amplifier for a sensing phase, when the reference and the sense current are compared. Implementation of this feature is another advantage of the amplifier, because the transmission gate may be implemented just by a single transistor.

In another embodiment the first input terminal of the first NAND gate and the first input terminal of the second NAND gate is connected to the sense control line input terminal via a third inverter.

This feature may prevent a situation in which the output value is undefined at the output terminal of the NAND gate (output terminal of the amplifier), when the amplifier is brought out of steady state. This mechanism will be discussed in greater detail further on below.

In another embodiment the reference current input terminal is connected to a reference current source.

The advantage of this feature may be that a reference current source may be implemented in a numerous ways. For instance it may be implemented by employing just a single transistor. This feature may enable a pseudo single-ended current sensing scheme where the reference current source provides the second current required for the differential amplifier.

In another embodiment the amplifier further comprises a fourth n-FET having a gate connected to the output terminal of the AND gate, a drain connected to the reference current input terminal, and a source connected to the ground terminal.

This feature may enable more stable operation of the amplifier. The reference current input terminal may be connected to the ground when the cross-coupled inverters are latched. The grounding may enable suppression of parasitic voltage drifts at the reference current input terminal. The grounding may further provide an effective resetting the reference current input terminal to a predefined state in a way that every next operation cycle is not affected by one or more previous operation cycles.

In another embodiment the amplifier further comprises a first NOR gate, wherein the gates of the third and the fourth n-FETs are connected to the output terminal of the AND gate via the first NOR gate, a first input terminal of the first NOR gate being connected to the output terminal of the AND gate, a second input terminal of the first NOR gate being connected to the sense control line input terminal.

This feature can be advantageous because it can enable synchronization of generation a reset signal at the gates of the third and the fourth transistor in a way that it is switched of as fast as possible in order to avoid parasitic currents flowing in the current sense amplifier when it is in transient sate.

In another embodiment the amplifier further comprises a second NOR gate. The first input terminal of the first NAND gate and the first input terminal of the second NAND gate are connected to an output terminal of the third inverter via the second NOR gate. A first input terminal of the second NOR gate is connected to the output terminal of the third inverter and a second input terminal of the NOR gate is connected to the sense control line input terminal This feature can be advantageous for providing proper timing of operation of the current sense amplifier in the sense phase. The sense current input terminal and the reference current input terminal are connected to the ground only after the cross-coupled inverters are latched, i.e. evaluation of data is completed by the sense current amplifier.

In another embodiment the amplifier further comprises a third NAND gate and an enable control line input terminal. The sense control line input terminal is connected to an input terminal of the third inverter via the third NAND gate. A first input terminal of the NAND gate is connected to the sense control line input terminal and a second input terminal of the NAND gate is connected to the enable control line input terminal.

This feature can be advantageous because the third NAND gate in conjunction with the enable control line input terminal can be used for masking operation of the current sense amplifier.

The current sense amplifier can be used for reading data stored in memory cells of electronic circuits. Each of the memory cells comprises a first static memory cell and a first data output terminal for outputting data stored in the first static memory cell. The first data output terminal of each of the first static memory cells is connected to the sense current input terminal. Each first data output terminal of said first static memory cells is connected via a respective first read n-FET stack to the sense current input terminal.

Utilization of the current sense amplifier for reading out digital data stored in the static memory cells may provide faster readout in comparison when a circuit evaluating electrical voltage is used for reading out the digital data stored in the static memory cells, because time required for establishing high and low currents representing different logical values in readout circuits can be shorter than the time needed for establishing high and low voltages representing different logical values in read out circuits.

In another embodiment the first read n-FET stacks are connected in a parallel arrangement to ground and the sense current input terminal, wherein each of the first data output terminals is connected to a gate of one of the n-FET transistors of the respective first read n-FET stacks.

This embodiment can be advantageous because it may enable evaluation of data stored in a large number of memory cells.

In another embodiment the reference current input terminal is connected to a current source configured to generate a current being bigger than zero and lower than a lowest of grounding currents with respect to the first read n-FET stacks, wherein the grounding current of an individual first read n-FET stack is given by the current that is flowing through the first read n-FET stack when all of its transistors are in a conducting state.

This embodiment may enable the operation of the amplifier within a large process parameter space.

In another embodiment each first data output terminal of said first static memory cells is further connected via a respective second read n-FET stack (120) to the sense current input terminal. The second read n-FET stacks are connected in a parallel arrangement to ground and the sense current input terminal. Each of the first data output terminals is connected to a gate of one of the n-FET transistors of the respective second read n-FET stacks via a respective invertor. The reference current input terminal is connected to a current source configured to generate a current being bigger than zero and lower than a lowest of grounding currents with respect to the first and the second read n-FET stacks. The grounding current of an individual first read n-FET stack is given by the current that is flowing through the first read n-FET stack when all of its transistors are closed. The grounding current of an individual second read n-FET stack is given by the current that is flowing through the second read n-FET stack when all of its transistors are in a conducting state.

This embodiment can be advantageous because it may enable reading not only data stored in the static memory cells but inverted data stored in the same static memory cells.

In another embodiment each of the memory cells further comprises a second static memory cell and a second data output terminal for outputting data stored in the respective second static memory cell. The second data output terminal of each of the second static memory cells is connected to the sense current input terminal. Each second data output terminal of said second static memory cells is connected via a respective second read n-FET stack to the sense current input terminal. The first and the second read n-FET stacks are connected in a parallel arrangement to ground and the sense current input terminal. Each of the first data output terminals is connected to a gate of one of n-FET transistors of the respective first read n-FET stacks. Each of the second data output terminals is connected to a gate of one of the n-FET transistors of the respective second read n-FET stacks. The reference current input terminal is connected to a current source configured to generate a current being bigger than zero and lower than a lowest of grounding currents with respect to the first and the second read n-FET stacks. The grounding current of an individual first read n-FET stack is given by the current that is flowing through the first read n-FET stack when all of its transistors are in a conducting state. The grounding current of an individual second read n-FET stack is given by the current that is flowing through the second read n-FET stack when all of its transistors are in a conducting state.

This embodiment may allow reading out digital data stored in ternary static memory cells.

Figure 1:
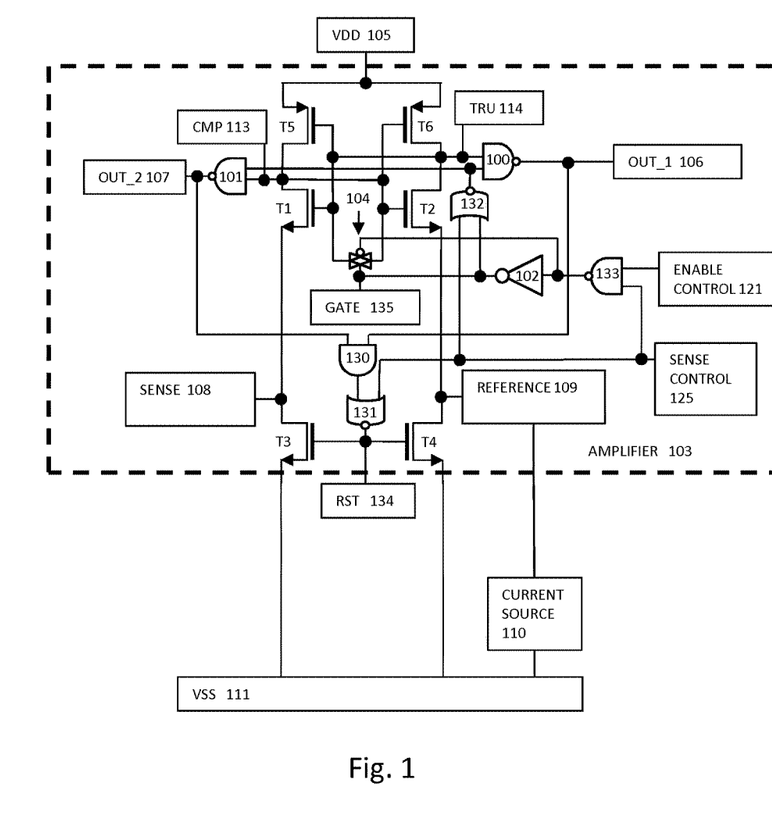
FIG. 1 illustrates a circuit diagram of a current sense amplifier.

FIG. 1 illustrates a circuit diagram of a current sense amplifier 103. The current sense amplifier comprises a reference current input terminal 109, a sense control line input terminal 125, a sense current input terminal 108, a first output terminal 106, a second output terminal 107, a first NAND gate 100, a second NAND gate 101, a first inverter 102, a transmission gate 104, and a first T1, T5 and a second T2, T6 two cross-coupled inverter.

The first cross-coupled inverter is based on a fifth p-type field effect transistor (p-FET) T5 and a first n-FET T1. The second cross-coupled inverter is based on an sixth p-FET T6 and a second n-FET T2. Sources of the n-FETs T1 and T2 are connected to the sense current input terminal 108 and the reference current input terminal 109, respectively. Sources of the fifth and the sixth p-FETs T5 and T6 are connected to power VDD 105.

Drains of the fifth p-FET T5 and the first n-FET T1 are connected to an output terminal of the first cross-coupled inverter. Gates of the fifth p-FET T5 and the first n-FET T1 are connected to an input terminal of the first cross-coupled inverter. Drains of the sixth p-FET T6 and the second n-FET T2 are connected to an output terminal of the second cross-coupled inverter. Gates of the sixth p-FET T6 and the second n-FET T2 are connected to an input terminal of the second cross-coupled inverter. The output terminal of the first cross-coupled inverter is connected to the input terminal of the second cross-coupled inverter. The output terminal of the second cross-coupled inverter is connected to the input terminal of the first cross-coupled inverter.

The transmission gate 104 comprises two transmission terminals and a transmission control terminal (e.g. gate terminal). The transmission control terminal is connected to the sense control line input terminal 125. The transmission control terminal of the transmission gate comprises a gate terminal of the n-FET comprised in the transmission gate. The gate of the n-FET of the transmission control terminal is connected to the sense control line input terminal 125 and to a node GATE 135. The transmission control terminal further comprises a gate terminal of the p-FET comprised in the transmission gate is connected to the inverted control line input terminal. One transmission terminal is connected to the output terminal of the first inverter and the other transmission terminal is connected to the output terminal of the second inverter. The transmission control terminal is operable for connecting and disconnecting the transmission terminals.

In an alternative implementation the transmission gate may only comprise one single n-FET or one single p-FET connected in same way as in the full transmission gate described above.

One input terminal of the first NAND gate 100 is connected via node TRU 114 to the output terminal of the second inverter. Another input terminal of the first NAND gate 100 is connected to the sense control line input terminal 125 via the first inverter 102. One input of the second NAND gate 101 is connected via node CMP 113 to the output terminal of the first inverter. Another input terminal of the second NAND gate 101 is connected to the sense control line input terminal 125 via the first inverter 102. An output terminal of the first NAND gate 100 is connected to the first output terminal 106. An output terminal of the second NAND gate 101 is connected to the second output terminal 107.

An input of the first inverter 102 is connected to the control line input terminal 125. The sense current input terminal 108 is further connected to a drain of a third n-FET T3, wherein a source of the third n-FET T3 is connected to ground terminal VSS 111. The third n-FET T3 is operable for connecting and disconnecting the sense current input terminal 108 with a ground terminal VSS 111. The reference current input terminal 109 can be further connected to a drain of a fourth n-FET T4, wherein a source of the fourth n-FET T4 is connected to ground terminal VSS 111. The fourth n-FET T4 is operable for connecting and disconnecting the reference current input terminal 109 with a ground terminal VSS 111.

The gates of the third T3 and the fourth T4 n-FET are connected to an output terminal of an AND gate 130 and a node RST 134. A first input terminal of the AND gate 130 is connected to the first output terminal 106 and a second input terminal of the AND gate 130 is connected to the second output terminal 107.

The reference current input terminal is connected to the ground terminal VSS 111 via a current source 110. One output terminal of the current source 110 is connected to the reference current input terminal 109 and the other output terminal of the current source is connected to the ground terminal VSS 111.

The sense current input terminal may be used for coupling of memory cells to it. The memory cells may be connected to the sense input current terminal via respective read n-FET stacks each. The current sense amplifier is configured to generate a logical value on the output terminal 106 and said logical value in an inverted form on the output terminal 107 when an electrical current flowing through the reference current input terminal is higher than an electrical current flowing through the sense current input terminal. The current sense amplifier is further configured to generate said logical value on the output terminal 107 and said logical value in an inverted form on the output terminal 106 when an electrical current flowing through the reference current input terminal is lower than an electrical current flowing through the sense current input terminal.

The current source 110 may be a fixed current source based on a single FET transistor. Alternatively, the current source 110 may be a programmable current source. For instance, the programmable current source may be implemented using a current mirror scheme.

The current sense amplifier 103 can further comprise a first NOR gate 131. The output terminal of AND gate 130 is connected to the gates of the third T3 and the fourth T4 n-FET via the first NOR gate 131. An output terminal of the NOR gate 131 is connected to the gates of the third T3 and the fourth T4 n-FET via the first NOR gate 131. A first input terminal of the NOR gate 131 is connected to the output terminal of the AND gate 130. A second input terminal of the NOR gate 131 is connected to the sense control line input terminal 125.

The current sense amplifier 103 can further comprise a second NOR gate 132. An output terminal of the third inverter 102 is connected to the input terminal of the first NAND gate 100 and the input terminal of the second NAND gate 101 via the second NOR gate 132. The input terminal of the first NAND gate 100 and the input terminal of the second NAND gate 101 are connected to the output terminal of the second NOR gate 132. The output terminal of the third inverter 102 is connected to a first input terminal of the second NOR gate 132. The second input terminal of the second NOR gate 132 is connected to the sense control line input terminal 125.

The current sense amplifier can further comprise a third NAND gate 133 and an enable control line input terminal 121. The transmission control terminal of the transmission gate 104 and the input terminal of the third inverter 102 are connected to the control line input terminal 125 via the third NAND gate 133. The transmission control terminal of the transmission gate 104 and the input terminal of the third inverter 102 are connected to an output terminal of the third NAND gate 133. A first input terminal of the third NAND gate 133 is connected to the sense control line input terminal 125. A second input terminal of the third NAND gate 133 is connected the enable control line input terminal 121.

Figure 2:
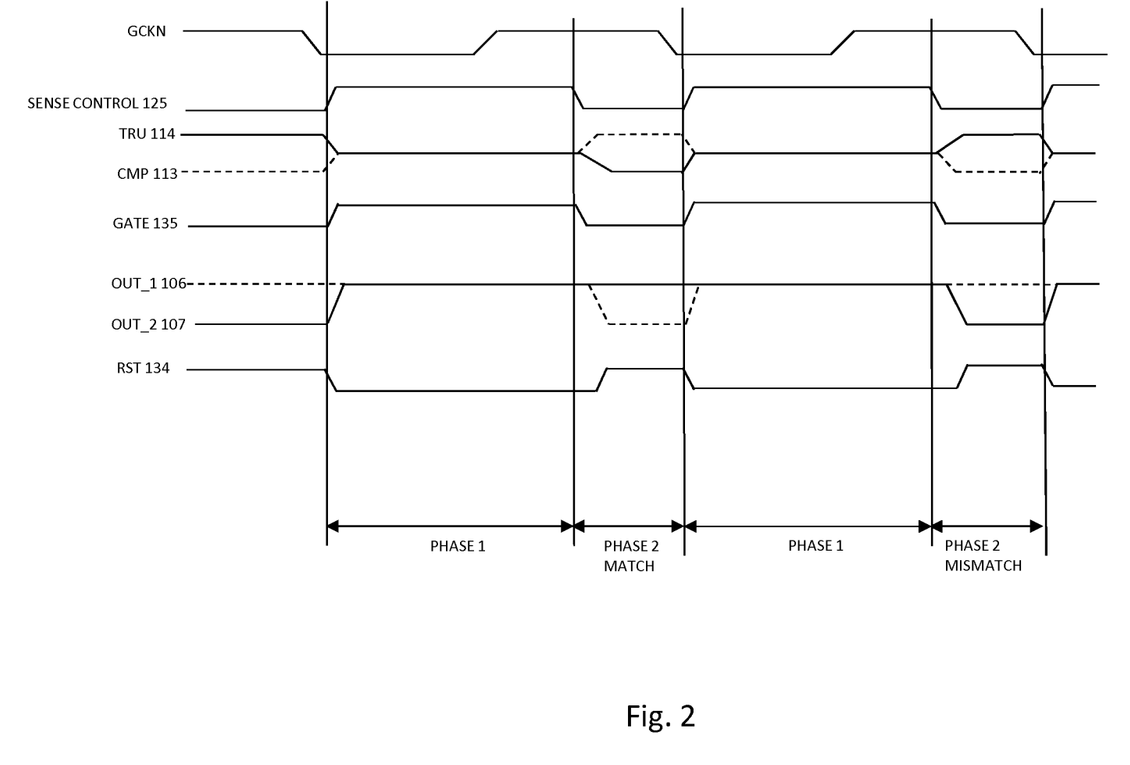
FIG. 2 illustrates a timing diagram associated with a current sense amplifier.
Figure 3:
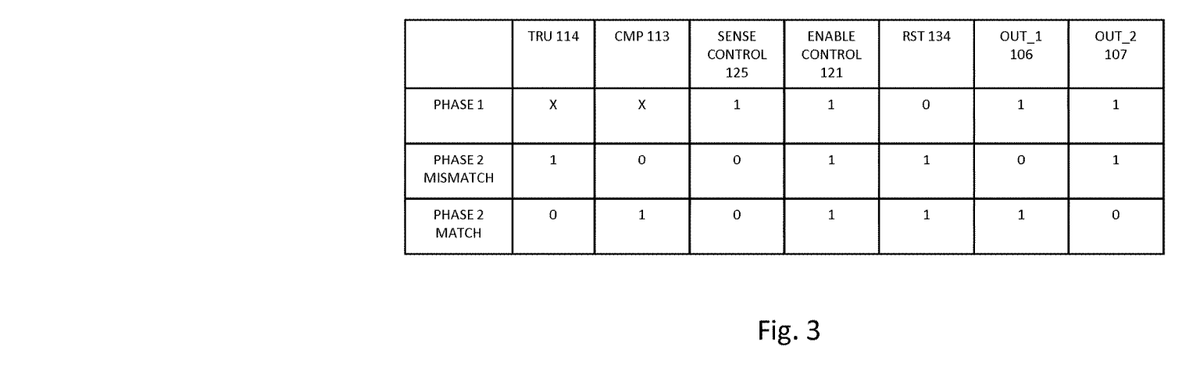
FIG. 3 illustrates a truth table associated with a current sense amplifier.

The operation of the amplifier depicted in FIG. 1 is illustrated in FIG. 2 and in FIG. 3. FIG. 2 is a timing diagram associated with the amplifier and FIG. 3 depicts a truth table of the amplifier. FIG. 2 illustrates time dependencies of voltages at following terminals and nodes being synchronized with a clock signal (GCKN trace in FIG. 2): the RST node 134 (RST 134 trace in FIG. 2), the sense control line input terminal 125 (SENSE CONTROL 125 trace in FIG. 2), the TRU 114 node (TRU 144 trace in FIG. 2), the CMP node 113 (CMP 113 trace in FIG. 2), the first output terminal 106 (OUT_1 106 trace in FIG. 2), the second output terminal 107 (OUT_2 trace in FIG. 2), and the GATE node 135 (GATE 135 trace in FIG. 2).

The operation of the amplifier comprises two phases 1 and 2. In both of phases a signal corresponding to logical value "1" is provided at the enable control line input terminal 133 in order to enable operation of the current sense amplifier 103. In phase 1 a voltage at the sense control line input terminal 125 is high (logical value "1"). This voltage causes the third NOR gate 132 independent of a logical signal at another input terminal of the NOR gate 132 to generate low voltage corresponding to logical value "0" at the input terminals of the NAND gates 100 and 101 connected to the output terminal of the inverter 102. As a result thereof both of the NAND gates 101 and 101 generate high voltages corresponding to logical value "1" at their output terminals. Said high voltage at the sense control line input terminal 125 further causes the transmission gate 104 to connect its transmission terminals only when a signal corresponding to logical value "1" is provided at the control line input terminal. Said high voltage is converted by the third NAND gate 133 into a low voltage corresponding to logical value "0", whereas said low voltage at the output terminal of the third NAND gate 133 drives the p-FET of the transmission gate into a conducting state. Said low voltage at the output terminal of the third NAND gate 133 is converted by the third inverter 102 again into a high voltage corresponding to logical value "1" which drives the n-FET of the transmission gate into a conducting state as well. As a result thereof the cross coupled inverters are driven out of a latch state, i.e. voltages at the nodes 113 and 114 are equal and may not correspond to either logical value "0" or logical value "1".

However this uncertainty does not affect performance of the digital circuitry connected to the output terminals 106 and 107 because both of the NAND gates 100 and 101 have on their input terminals connected to the output terminal of the second NOR gate 132 the low voltage corresponding to a logical value "0" and thus the output terminals of NAND gates 100 and 101 are driven to the high voltage corresponding to a logical "1" independent of the voltage levels of nodes CMP 113 and TRU 114. This case corresponds to the row "PHASE 1" of the truth table in the FIG. 3. The logical values of the TRU and CMP nodes are marked as X in this row because the logical values at these nodes are not defined in phase 1.

The logical value "0" at the output terminal of the second NOR gate 132 is generated in phase 1 because one of its input terminals is connected to the sense control line input terminal 125 at which the logical value "1" is provided in phase 1. In addition, another input terminal of the second NOR gate 132 is connected to an output terminal of the third inverter 102 outputting logical value "1" if logical value "1" is provided at the enable control line input terminal 121.

When logical value "0" is provided at the enable control line input terminal 121, the third NAND gate blocks connection of the transmission terminals of the transmission gate 104 in phase 1. As a result thereof in the next following phase 2 logical values generated at the first 106 and the second 107 output terminal during the last previously executed phase 1 when logical value "1" was provided at the enable control line input terminal 121, are provided again. In other words, the last logical value evaluated by the sense current amplifier is outputted, when sensing is disabled by providing logical value "0" at the enable control line input terminal 121.

The voltage at node RST 134 is low in phase 1, because the high voltage corresponding to logical value "1" provided at the sense control line input terminal is converted by the first NOR gate 131 into low voltage corresponding to logical value "0". As a result thereof, the third T3 and the fourth T4 n-FET are closed.

In phase 2 a comparison of a reference current flowing through the reference current input terminal 109 and a sense current flowing through sense current input terminal 108 is performed. FIG. 2 depicts a match case when the sense current is current is lower than the reference current and after the match case a mismatch case when the sense current is current is lower than the reference current. In the match case a current flowing through the transistors T6 and T2 is higher than a current flowing through the transistors T5 and T1, i.e. the node TRU 114 is pulled down stronger than the node CMP 113. As a result thereof the cross coupled transistors are driven into a latched state, wherein a low voltage corresponding to logical value "0" is established on the node TRU 114 and the corresponding input terminal of the first NAND gate 100 and a high voltage corresponding to logical value "1" is established on the node CMP 113 and the corresponding input terminal of the second NAND gate 101. This case is illustrated in a row "PHASE 2 MATCH" of the Table depicted on FIG. 3.

FIG. 2 further depicts the mismatch case, when a current flowing through the transistors T8 and T2 is lower than a current flowing through the transistors T7 and T1, i.e. the node CMP 113 is pulled down stronger than the node TRU 114. As a result thereof the cross coupled transistors are driven into a latched state, wherein a low voltage corresponding to logical value "0" is established on the node CMP 113 and the corresponding input terminal of the second NAND gate 101 and a high voltage corresponding to logical value "1" is established on the node TRU 114 and the corresponding input terminal of the first NAND gate 100. This case is illustrated in a row "PHASE 2 MISMATCH" of the Table depicted on FIG. 3.

In the phase 2 a voltage at the control line input terminal is low (logical value "0"). This voltage causes the second NAND gate 132 to generate high voltage (logical value "1") at the input terminal of the first NAND 100 gate and the input terminal of the second NAND gate 101. As a result thereof the first NAND gate 100 generates at the first output terminal 106 a logical value being equal to the inverted logical value at the node TRU 114 and the second NAND gate 100 generates at the second output terminal 106 a logical value being equal to the inverted logical value at the node CMP 113.

The third T3 and the fourth T4 n-FET are switched in a conducting state in phase 2 (i.e. the reset of the sense current input terminal and the reference current input terminal is performed) only after the cross-coupled inverters are latched (i.e. the process of sensing/comparison of the currents flowing through the sense 108 and reference 109 current input terminal is completed) and different logical values are generated at the first 106 and the 107 second output terminals. The different logical values at the first 106 and the second 107 output terminals cause the AND gate 103 to generate logical value "0". In its own turn logical value "0" generated by the AND gate 103 at the input terminal of the first NOR gate 131 causes the first NOR gate to generate high voltage (logical value "1") at the gates of the third T3 and the fourth T4 n-FET. The generated by the first NOR gate 131 high voltage drives the third T3 and the fourth T4 n-FET into a conducting state.

Figure 4:
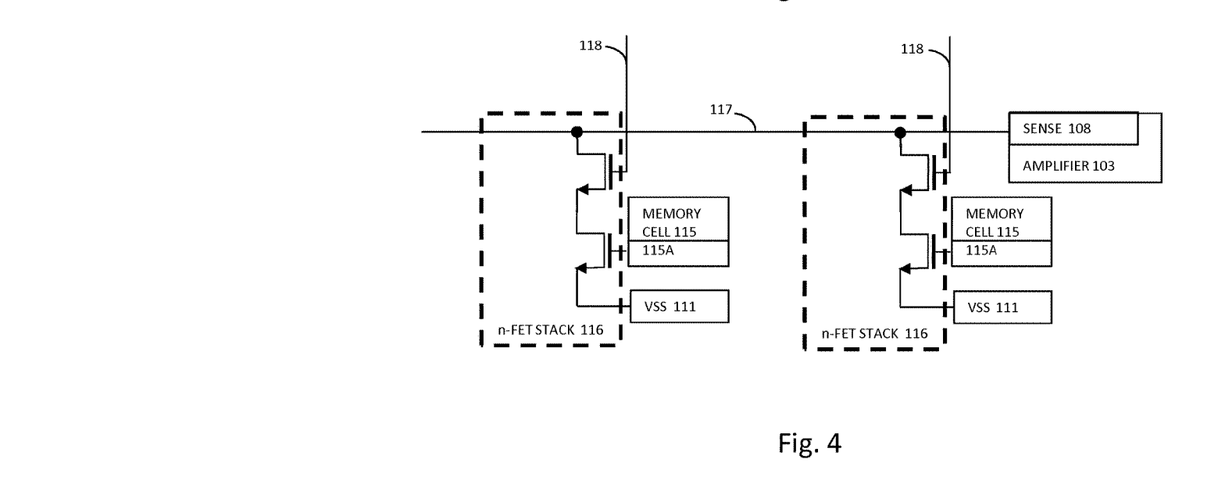
FIG. 4 illustrates a circuit diagram of an electronic circuit comprising memory cells and a current sense amplifier.

FIG. 4 illustrates an electronic circuitry comprising the amplifier 103. First output terminals 115A of memory cells 115 are configured to output logical values stored in the memory cells. The memory cells may be static memory cells. The static memory cells may be but are not limited to six transistor memory cells, eight transistor memory cells, or pairs of cross coupled inverters. Each of the first output terminals is configured to generate a high voltage corresponding to a logical value "1" when a logical value "1" is stored in the memory cell and to generate a low voltage corresponding to a logical value "0" when a logical value "0" is stored in the memory cell.

The first output terminals 115A are each connected in parallel to the sense current input terminal 108 via a respective first read circuitry. Each of the first read circuitries may be a single n-FET transistor or a first read stack of n-FET transistors and configured to couple the sense current input terminal to a ground terminal VSS 111.

For instance, the first read circuitry may be a single n-FET transistor having a source connected to the ground terminal VSS 111, a drain connected to the sense current input terminal, and gate connected to the first output terminal 115A of the respective memory cell 115.

The n-FET transistor is operable to switch in a conducting state, when the high voltage is generated at the first output terminal of the respective memory cell, and to switch into a non-conducting state, when the low voltage is generated at the first output terminal of the respective memory cell. Said n-FET transistors may be comprised into a respective n-FET first stack 116, each. The n-FET first stacks may comprise additional n-FET transistors connected in series.

FIG. 4 depicts an example case when each of the first read n-FET stacks 116 comprises two n-FET transistors connected in series. A gate of one of the transistors of each of the first stacks 116 is connected to the first output terminal 115A of the respective memory cell 115. A gate of another transistor of each of the first stacks 116 is connected to a respective select line 118 (e.g. word line). The select lines 118 may be used for masking the data stored in one or more of the memory cells during evaluation of data stored in the one or more of the memory cells (phase 2).

The configuration of the circuitry depicted in FIG. 4 may imply criteria on a choice of a value of the reference current generated by the current generator 110 in phase 2. The current generator has to generate an electrical current being lower than any of the currents flowing through the sense current input terminal when at least one of the first read circuitries connects the sense current input terminal to the ground terminal.

Turning back to the example depicted on FIG. 4 the reference current has to be lower than any of currents flowing though one of the first read n-FET stacks when all transistors of said first read n-FET stack are in conducting state. On the other hand the current generator has to generate the reference current higher than a parasitic current flowing through the sense current input terminal when any of said first read circuitries do not connect the sense current input terminal to the ground terminal. The parasitic current may be caused by a leakage current of a wiring 117 connecting the first read circuitries to the sense current input terminal 108 and/or by parasitic leakage currents of the first read circuits themselves.

The aforementioned interval for an allowable reference current may be further reduced to a sub-interval for the allowable reference current. For instance, the sub-interval may be reduced to 50% of the aforementioned interval. It may be a lower, top, or central part of the aforementioned interval.

Figure 5:
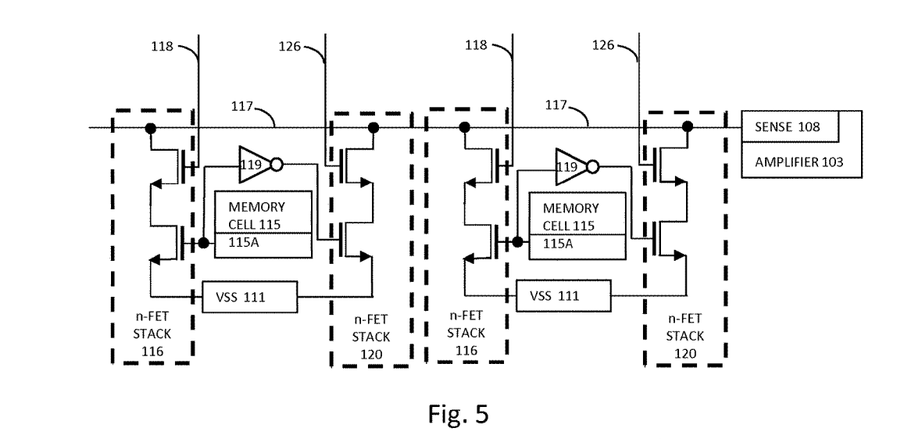
FIG. 5 illustrates a circuit diagram of an electronic circuit comprising memory cells and a current sense amplifier.

FIG. 5 illustrates another electronic circuitry comprising the amplifier 103. In comparison with the electronic circuitry depicted in the FIG. 4 the first output terminals 115A of the memory cells 115 are further connected via respective inverters 119 and second read circuitries 120 to the current sense input terminal. The input terminals of the inverters are connected to the respective first output terminals of the memory cells. The output terminals of the inverters 119 are connected to the sense current input terminal via the respective second read circuits 120, each.

The operation principle of the second read circuits 120 is the same as the operation principle of the first read circuits 116. Each second read circuit may comprise one read n-FET transistor or a second read stack of n-FET transistors. One of n-FET transistors of each of the second read circuits is connected to the output terminal of the respective inverter 119. In case when the second read circuitry comprises the second read n-FET stack, each, a gate of one of transistors of the second read n-FET stacks 120 may be connected to a select line 126 (e.g. word line) as depicted on the FIG. 5.

The select lines 126 and 118 may be used for masking data stored in one or more of the memory cells 115 during evaluation of data stored in the one or more memory cells (phase 2). The interval of allowable reference currents may be determined in a similar way as for the electronic circuitry depicted on the FIG. 4, wherein currents flowing through the second read circuits are taken in account as well.

Figure 6:
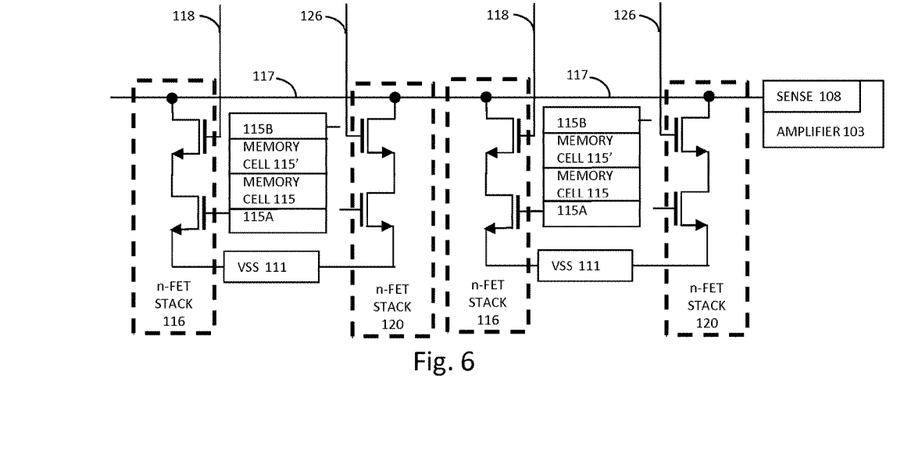
FIG. 6 illustrates a circuit diagram of an electronic circuit comprising memory cells and a current sense amplifier.

FIG. 6 illustrates yet another electronic circuitry comprising the amplifier 103. In comparison with the electronic circuitry depicted in FIG. 4 the memory cell is a ternary memory cell comprising a first memory cell 115 and a second memory cell 115'. The first and the second memory cell can be static memory cells. Each of the first memory cells 115 has its first output terminal 115A for outputting its stored data. Each of the second memory 115' cell has its second output terminal 115B for outputting its stored data. Each of the first output terminals is connected via a respective first read circuitry 116 to the sense current input terminal 108 of the current sense amplifier 103. Each of the second output terminals 115B is connected via a respective second read circuitry 120 to the sense current input terminal 108 of the current sense amplifier 103. The first 116 and the second 120 read circuitry depicted on FIG. 6 can be the same as the first 116 and the second 120 read circuitries depicted in FIG. 5.

The select lines 126 and 118 depicted in FIG. 6 may be used for masking data stored in one or more of the memory cells 115, 115' during evaluation of data stored in the one or more memory cells (phase 2). The interval of allowable reference currents may be determined in a similar way as for the electronic circuitry depicted on the FIG. 4, wherein currents flowing through the second read circuits 120 are taken in account as well.

Figure 7:
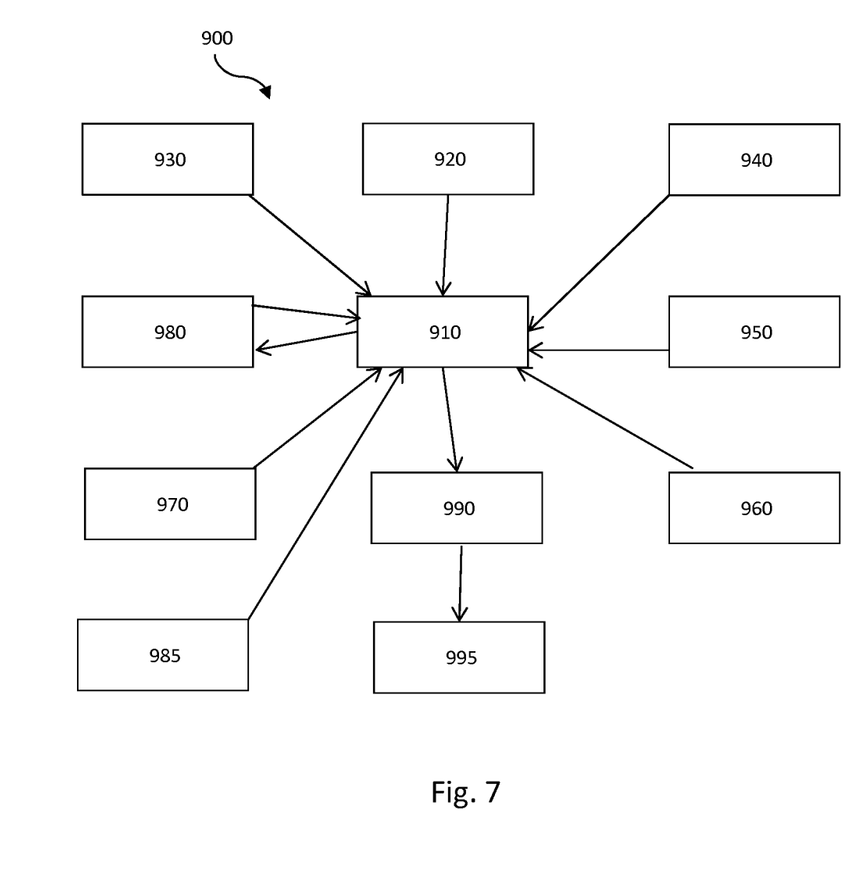
FIG. 7 illustrates a flow diagram of a design process used in semiconductor design, manufacture, and/or test.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1, 4, 5, 6.

The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as this shown in FIGS. 1, 4-6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structure shown in FIGS. 1, 4-6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 20 nm, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1a-d and 2a-e. In one embodiment, design structure 990 may comprise a compiled, executable HDL simulation model that functionally simulates the devices shown in FIGS. 1, 4-6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 4-6. Design structure 990 may then proceed to a stage 995 where, for example, design structure 990: proceeds to tape-out, is released to manufacturing, is released to a mask house, is sent to another design house, is sent back to the customer, etc.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A current sense amplifier comprising:
   a reference current input terminal;
   a sense control line input terminal;
   a sense current input terminal;
   a first output terminal;
   a first NAND gate having an output terminal connected to the first output terminal;
   a second output terminal;
   a second NAND gate having an output terminal connected to the second output terminal;
   a first cross coupled inverter comprising a first n-FET;
   a second cross coupled inverter comprising a second n-FET;
   a transmission gate comprising a first and a second transmission terminal and a transmission control terminal, the transmission control terminal being connected to the sense control line input terminal;
   an AND gate having a first input terminal connected to the first output terminal and a second input terminal connected to the second output terminal; and
   a third n-FET having a gate connected to an output terminal of the AND gate, a drain connected to the sense current input terminal, and a source connected to ground;
   wherein a source of the first n-FET is connected to the sense current input terminal and a source of the second n-FET is connected to the reference current input terminal;
   and wherein a first input terminal of the first NAND gate and a first input terminal of the second NAND gate are connected to the sense control line input terminal; and
   wherein the first transmission terminal and a second input terminal of the first NAND gate are connected to an output terminal of the second inverter and the second transmission terminal and a second input terminal of the second NAND gate are connected to an output terminal of the first inverter.

2. The amplifier of claim 1, the transmission control terminal being operable for connecting and disconnecting the first with the second transmission terminal.

3. The amplifier of claim 1, the first input terminal of the first NAND gate and the first input terminal of the second NAND gate being connected to the sense control line input terminal via a third inverter.

4. The amplifier of claim 3, the amplifier further comprising a second NOR gate, wherein the first input terminal of the first NAND gate and the first input terminal of the second NAND gate are connected to an output terminal of the third inverter via the second NOR gate, wherein a first input terminal of the second NOR gate is connected to the output terminal of the third inverter and a second input terminal of the NOR gate is connected to the sense control line input terminal.

5. The amplifier of claim 4, the amplifier further comprising a third NAND gate and an enable control line input terminal, wherein the sense control line input terminal is connected to an input terminal of the third inverter via the third NAND gate, wherein a first input terminal of the NAND gate is connected to the sense control line input terminal and a second input terminal of the NAND gate is connected to the enable control line input terminal.

6. The amplifier of claim 1, wherein the reference current input terminal is connected to a reference current source.

7. The amplifier of claim 1, the amplifier further comprising a fourth n-FET having a gate connected to the output terminal of the AND gate, a drain connected to the reference current input terminal, and a source connected to the ground terminal.

8. The amplifier of claim 7, the amplifier further comprising a first NOR gate, wherein the gates of the third and the fourth n-FETs are connected to the output terminal of the AND gate via the first NOR gate, a first input terminal of the first NOR gate being connected to the output terminal of the AND gate, a second input terminal of the first NOR gate being connected to the sense control line input terminal.

9. An electronic circuit comprising memory cells and a current sense amplifier according to claim 1, each of the memory cells comprising a first static memory cell and a first data output terminal for outputting data stored in the first static memory cell, the first data output terminal of each of the first static memory cells being connected to the sense current input terminal, wherein each first data output terminal of said first static memory cells is connected via a respective first n-FET stack to the sense current input terminal.

10. The circuit of claim 9, wherein the first read n-FET stacks are connected in a parallel arrangement to ground and the sense current input terminal, wherein each of the first data output terminals is connected to a gate of one of the n-FET transistors of the respective first read n-FET stacks.

11. The circuit of claim 10, wherein each first data output terminal of said first static memory cells is further connected via a respective second read n-FET stack to the sense current input terminal, wherein the second read n-FET stacks are connected in a parallel arrangement to ground and the sense current input terminal, wherein each of the first data output terminals is connected to a gate of one of the n-FET transistors of the respective second read n-FET stacks via a respective invertor, wherein the reference current input terminal is connected to a current source configured to generate a current being bigger than zero and lower than a lowest of grounding currents with respect to the first and the second read n-FET stacks, wherein the grounding current of an individual first n-FET stack is given by the current that is flowing through the first n-FET stack when all of its transistors are in a conducting state, wherein the grounding current of an individual second read n-FET stack is given by the current that is flowing through the second n-FET stack when all of its transistors are in a conducting state.

12. The circuit of claim 9, wherein the reference current input terminal is connected to a current source configured to generate a current being bigger than zero and lower than a lowest of grounding currents with respect to the first read n-FET stacks, wherein the grounding current of an individual first read n-FET stack is given by the current that is flowing through the first read n-FET stack when all of its transistors are in a conducting state.

13. The circuit of claim 9, each of the static memory cells further comprising second static memory cell a second data output terminal for outputting data stored in the respective second static memory cell, the second data output terminal of each of the second static memory cells being connected to the sense current input terminal, wherein each second data output terminal of said second static memory cells is connected via a respective second read n-FET stack to the sense current input terminal, wherein the first and the second read n-FET stacks are connected in a parallel arrangement to ground and the sense current input terminal, wherein each of the first data output terminals is connected to a gate of one of n-FET transistors of the respective first read n-FET stacks, wherein each of the second data output terminals is connected to a gate of one of the n-FET transistors of the respective second read n-FET stacks, wherein the reference current input terminal is connected to a current source configured to generate a current being bigger than zero and lower than a lowest of grounding currents with respect to the first and the second read n-FET stacks, wherein the grounding current of an individual first read n-FET stack is given by the current that is flowing through the first read n-FET stack when all of its transistors are in a conducting state, wherein the grounding current of an individual second read n-FET stack is given by the current that is flowing through the read second n-FET stack when all of its transistors are in a conducting state.

14. An electronic circuit comprising:
memory cells; and
a current sense amplifier comprising:
 a reference current input terminal configured to receive a reference current;
 a sense control line input terminal coupled to a transmission control terminal configured to connect and disconnect transmission terminals;
 a sense current input terminal configured to receive sensed currents from the memory cells, wherein the current sense amplifier is configured to compare the sensed currents to the reference current;
 a first output terminal;
 a second output terminal, wherein respective output signals of the first and second output terminals are set based on comparing the sensed currents to the reference current; and
 an AND gate having a first input terminal connected to the first output terminal and a second input terminal connected to the second output terminal,
 wherein each of the memory cells comprises a first static memory cell and a first data output terminal for outputting data stored in the first static memory cell, wherein the first data output terminal of each of the first static memory cells is connected to the sense current input terminal via a respective first n-FET stack.

15. An electronic circuit comprising:
memory cells; and
a current sense amplifier comprising:
 a reference current input terminal configured to receive a reference current;
 a sense current input terminal configured to receive sensed currents from the memory cells, wherein the current sense amplifier is configured to compare the sensed currents to the reference current;
 a first output terminal;
 a second output terminal, wherein respective output signals of the first and second output terminals are set based on comparing the sensed currents to the reference current; and
 an AND gate having a first input terminal connected to the first output terminal and a second input terminal connected to the second output terminal,
 wherein each of the memory cells comprises a first static memory cell and a first data output terminal for outputting data stored in the first static memory cell, wherein the first data output terminal of each of the first static memory cells is connected to the sense current input terminal via a respective first n-FET stack.

* * * * *